United States Patent
Cha et al.

(10) Patent No.: US 11,785,733 B2
(45) Date of Patent: Oct. 10, 2023

(54) DISPLAY APPARATUS

(71) Applicant: SAMSUNG ELECTRONICS CO., LTD., Suwon-si (KR)

(72) Inventors: Minwoo Cha, Suwon-si (KR); Dongoh Kim, Suwon-si (KR); Dongchan Lee, Suwon-si (KR); Youngchan Lee, Suwon-si (KR); Jiseok Jung, Suwon-si (KR); Yoongoo Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 74 days.

(21) Appl. No.: 17/197,322

(22) Filed: Mar. 10, 2021

(65) Prior Publication Data
US 2021/0289649 A1 Sep. 16, 2021

(30) Foreign Application Priority Data
Mar. 11, 2020 (KR) .......... 10-2020-0029965

(51) Int. Cl.
*H05K 5/06* (2006.01)
*G06F 1/16* (2006.01)
*H05K 5/00* (2006.01)

(52) U.S. Cl.
CPC .......... *H05K 5/061* (2013.01); *G06F 1/1601* (2013.01); *H05K 5/0017* (2013.01)

(58) Field of Classification Search
CPC ..... G06F 1/1601; H05K 5/0017; H05K 5/061
See application file for complete search history.

(56) References Cited

U.S. PATENT DOCUMENTS 2,117,807 A * 5/1938 Jesser ............. B65D 45/32
                                                                277/645
3,065,517 A * 11/1962 Dower ............ A61G 17/036
                                                                277/648
(Continued)

FOREIGN PATENT DOCUMENTS

| CN | 108779658 A | 11/2018 |
| DE | 2137849 | 2/1973 |

(Continued)

OTHER PUBLICATIONS

Translation of JP-2004232289-A (Year: 2004).*
(Continued)

*Primary Examiner* — Abhishek M Rathod
*Assistant Examiner* — Keith DePew
(74) *Attorney, Agent, or Firm* — STAAS & HALSEY LLP

(57) ABSTRACT

A display apparatus including a sealing member having an improved structure, the display apparatus includes a housing including an opening, a display module including a display panel, the display module arranged inside the housing for the image to be displayed through the opening, a housing cover coupled to the housing to cover the opening while covering a rear surface of the display module, and a sealing member provided to seal a gap between the housing and the housing cover, the sealing member including a contact surface convexly formed toward the housing cover and a first protrusion and a second protrusion arranged on the contact surface, wherein at least a portion of the contact surface located between the first protrusion and the second protrusion is located at a same level as the first protrusion and the second protrusion or protrudes outward of the first protrusion and the second protrusion.

19 Claims, 14 Drawing Sheets

(56) References Cited

U.S. PATENT DOCUMENTS

| | | | | |
|---|---|---|---|---|
| 3,360,887 | A | * | 1/1968 | Parks ................. E06B 7/2312 |
| | | | | 49/467 |
| 4,091,961 | A | * | 5/1978 | DuBois ................ B65D 53/02 |
| | | | | 277/648 |
| 4,555,119 | A | * | 11/1985 | Semon ................ A61G 17/036 |
| | | | | 277/648 |
| 6,141,667 | A | * | 10/2000 | Duff ..................... G06F 1/182 |
| | | | | 708/100 |
| 6,599,153 | B2 | * | 7/2003 | Nishide ............ H01R 13/6456 |
| | | | | 439/271 |
| 6,702,301 | B1 | * | 3/2004 | Davies .................... E06B 7/18 |
| | | | | 277/630 |
| 9,119,285 | B2 | * | 8/2015 | Tarkington .......... H05K 9/0015 |
| 9,457,941 | B2 | * | 10/2016 | Kawakami ............ B65D 53/00 |
| 10,844,645 | B2 | | 11/2020 | Hirtenlehner et al. |
| 11,119,389 | B2 | | 9/2021 | Owaki |
| 11,434,687 | B2 | * | 9/2022 | Grein ..................... B60Q 1/323 |
| 11,590,021 | B2 | * | 2/2023 | Williams ................ A61F 7/007 |
| 2008/0265528 | A1 | | 10/2008 | Heiman et al. |
| 2012/0135300 | A1 | | 5/2012 | Ota |
| 2012/0243196 | A1 | * | 9/2012 | Lee ........................ F16M 11/16 |
| | | | | 361/807 |
| 2013/0335285 | A1 | * | 12/2013 | Tarkington ............... H01Q 1/44 |
| | | | | 174/351 |
| 2014/0111917 | A1 | * | 4/2014 | Takita .................... H05K 5/061 |
| | | | | 361/679.01 |
| 2014/0268521 | A1 | * | 9/2014 | Kawai ................. H04M 1/0249 |
| | | | | 361/679.01 |
| 2018/0363808 | A1 | * | 12/2018 | Okamoto ............... F16J 15/022 |
| 2019/0049774 | A1 | * | 2/2019 | In ......................... G06F 1/1601 |
| 2019/0100955 | A1 | * | 4/2019 | Hirtenlehner ............ E05F 15/46 |
| 2020/0190897 | A1 | * | 6/2020 | Grein ..................... B60Q 1/324 |
| 2021/0041767 | A1 | * | 2/2021 | Owaki ................... H04N 23/52 |
| 2021/0170835 | A1 | * | 6/2021 | Fukui .................... E05F 15/689 |
| 2022/0285767 | A1 | * | 9/2022 | Kim ..................... H01M 50/224 |

FOREIGN PATENT DOCUMENTS

| | | | |
|---|---|---|---|
| DE | 10 2013 101 263 | A1 | 8/2014 |
| EP | 3 306 172 | A1 | 4/2018 |
| EP | 3 333 464 | A1 | 6/2018 |
| JP | 2004-232289 | A | 8/2004 |
| JP | 2004232289 | A * | 8/2004 |
| JP | 2013-183195 | A | 9/2013 |
| JP | 2013-211844 | A | 10/2013 |
| JP | 2014-81066 | | 5/2014 |
| JP | 2014-214778 | | 11/2014 |
| JP | 2019-138925 | | 8/2019 |
| KR | 10-2009-0050165 | | 5/2009 |
| KR | 10-1022355 | | 3/2011 |
| KR | 10-2014-0016052 | | 2/2014 |
| KR | 10-2019-0061312 | | 6/2019 |
| WO | WO 2011/096159 | A1 | 8/2011 |
| WO | WO 2019/155722 | A1 | 8/2019 |

OTHER PUBLICATIONS

European Search Report for Application No. 21 15 7983.4-1203 dated Jul. 28, 2021.
PCT International Search Report for PCT Application No. PCT/KR2021/002298 dated Jun. 16, 2021.
Office Action dated Jan. 24, 2023 in European Patent Application No. 21 157 983.4 (6 pages).
Office Action dated Jun. 30, 2023 in Chinese Patent Application no. 202110257770.4.

* cited by examiner

DISPLAY APPARATUS

CROSS-REFERENCE TO RELATED APPLICATION

This application is based on and claims priority under 35 U.S.C. § 119 to Korean Patent Application No. 10-2020-0029965, filed on Mar. 11, 2020 in the Korean Intellectual Property Office, the disclosure of which is incorporated herein by reference.

BACKGROUND

1. Field

The disclosure relates to a display apparatus, and more specifically, to a display apparatus including a sealing member.

2. Description of the Related Art

In general, a display apparatus is an apparatus that displays an image on a screen, such as a television, a computer monitor, and a digital information display. In recent years, display apparatuses are often installed outside a building or an open-air place for advertisement. In addition, even not for advertisement purpose, display apparatuses may be installed outdoors, such as a garden or a rooftop.

When such a display apparatus is installed outdoors as described above, the display apparatus may be exposed to water due to various reasons, such as rain or snow. In addition, the display apparatus may be exposed to dust.

In order for the display apparatus to operate normally even at outdoors, the display apparatus needs to block inflow of water and dust. That is, the display apparatus needs to have a waterproof and a dustproof function.

SUMMARY

According to an aspect of the disclosure, there is provided a display apparatus including: a housing including an opening; a display module including a display panel on which an image is displayed, the display module arranged inside the housing for the image to be displayed through the opening; a housing cover coupled to the housing to cover the opening while covering a rear surface of the display module; and a sealing member provided to seal a gap between the housing and the housing cover, the sealing member including a contact surface convexly formed toward the housing cover and a first protrusion and a second protrusion arranged on the contact surface, wherein at least a portion of the contact surface located between the first protrusion and the second protrusion is located at a same level as the first protrusion and the second protrusion or protrudes outward of the first protrusion and the second protrusion.

The at least a portion of the contact surface may include a center of the contact surface.

The housing may include a sealing member groove into which the sealing member is inserted, wherein the sealing member may include: a protrusion portion formed to be inserted into the sealing member groove; and a head portion configured to be compressed by the housing cover in response to the housing cover being coupled to the housing, the head portion including the contact surface.

The head portion may include a hollow formed along a direction in which the sealing member extends, and the hollow may have a cross section including an arc portion and a straight-portion.

The contact surface may be provided in an arc shape having a highest position at a center thereof.

The first protrusion and the second protrusion may extend along a direction in which the sealing member extends.

The head portion may be provided to have a center of the contact surface, a point of the first protrusion, and a point of the second protrusion come in contact with the housing cover while the housing cover is coupled to the housing.

When the sealing member extends in a first direction, and the housing cover is coupled to the housing by moving in a second direction crossing the first direction, the protrusion portion may have a length in the second direction greater than a length of the head portion in the second direction.

When a length of the head portion in a third direction crossing the first direction and the second direction is defined as a first width (w1), and a length of the protrusion portion in the third direction is defined as a second width (w2), the first width (w1) and the second width (w2) may be set to satisfy w1*⅔<w2.

The sealing member may be formed by extrusion, and one end of the sealing member may be bonded to an other end of the sealing member to form a closed loop.

The housing may further include: a side portion provided to cover a side surface of the display module; an extension portion extending from the side portion in a first direction toward an inside of the housing; and a pair of support walls extending from the extension portion in a second direction toward the housing cover, wherein the sealing member groove may be defined by the pair of support walls and the extension portion.

The sealing member may include a protrusion portion formed to be inserted into the sealing member groove, the protrusion portion may include a pair of fixing groove formed by both side surface of the protrusion portion being recessed inward, and each of the pair of support walls may include a fixing protrusion formed to be inserted into a corresponding one of the fixing grooves to prevent the sealing member from being withdrawn from the sealing member groove.

The housing may further include a cover groove formed between the side portion and the support wall and into which one end portion of the housing cover is inserted.

The display apparatus may further include a connector case accommodated in the housing, and having an inner space to accommodate a connector, wherein the housing cover may include: an opening portion corresponding to the connector case and passing through the housing cover; and a connector cover configured to expose or cover the inner space by opening or closing the opening portion.

The connector case may include a connector sealing member extending along an edge of the connector case and provided to seal a gap between the connector case and the connector cover.

According to another aspect of the disclosure, there is provided a display apparatus including: a display module configured to display an image; a housing configured to accommodate the display module for the image to be displayed through a front that is open, and cover a side surface of the display module; a housing cover coupled to a rear surface of the housing to cover a rear surface of the display module; and a sealing member configured to seal a gap between the housing and the housing cover, and including a protrusion portion coupled to the housing and a head portion provided to be compressed by the housing cover, wherein the head portion includes: a contact surface configured to come in contact with the housing cover and having an arc shape convexly formed toward the housing cover; and a first protrusion and a second protrusion protruding from the contact surface toward the housing cover and arranged to be spaced apart from each other.

At least a portion of the contact surface located between the first protrusion and the second protrusion may be located at a same level as the first protrusion and the second protrusion or may protrude outward of the first protrusion and the second protrusion.

When the sealing member extends in a first direction, and the housing cover may be coupled to the housing by moving in a second direction crossing the first direction, the protrusion portion has a length in the second direction greater than a length of the head portion in the second direction.

When a length of the head portion in a third direction crossing the first direction and the second direction is defined as a first width (w1), and a length of the protrusion portion in the third direction is defined as a second width (w2), the first width (w1) and the second width (w2) may be set to satisfy $w1*\frac{2}{3}<w2$.

According to another aspect of the disclosure, there is provided a display apparatus including: a display module; a housing including a side portion configured to cover a side surface of the display module, an extension portion extending from the side portion, and a sealing member groove formed in the extension groove while being spaced apart from the side portion by a predetermined distance, the housing configured to accommodate the display module; a housing cover coupled to the housing to accommodate the display module together with the housing; and a sealing member including a protrusion portion formed to be inserted into the sealing member groove and a head portion including a curved surface formed in a convex shape and a first protrusion and a second protrusion provided on the curved surface, wherein at least a portion of the curved surface located between the first protrusion and the second protrusion is located at a same level with the first protrusion and the second protrusion or protrudes outward of the first protrusion and the second protrusion.

Additional aspects of the disclosure will be set forth in part in the description which follows and, in part, will be obvious from the description, or may be learned by practice of the disclosure.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Embodiments set forth herein and illustrated in the configuration of the disclosure are only the most preferred embodiments and are not representative of the full the technical spirit of the disclosure, so it should be understood that they may be replaced with various equivalents and modifications at the time of the disclosure.

The terminology used herein is for the purpose of describing particular embodiments only and is not intended to limit the disclosure. It is to be understood that the singular forms "a," "an," and "the" include plural references unless the context clearly dictates otherwise. It will be further understood that the terms "include", "comprise" and/or "have" when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. Thus, a first element, component, region, layer or section discussed below could be termed a second element, component, region, layer or section without departing from the teachings of the disclosure.

Hereinafter, embodiments of the disclosure will be described with reference to the accompanying drawings.

Although the disclosure is described in relation to a flat panel display device 1 as an example of the display apparatus, but the disclosure may be applied to a variable (bendable of flexible) type display apparatus that is variable between a curved shape and a flat shape.

In addition, the disclosure is described in relation to an outdoor display apparatus as an example, but the disclosure may be applied to a display device installed indoors.

Figure 1:
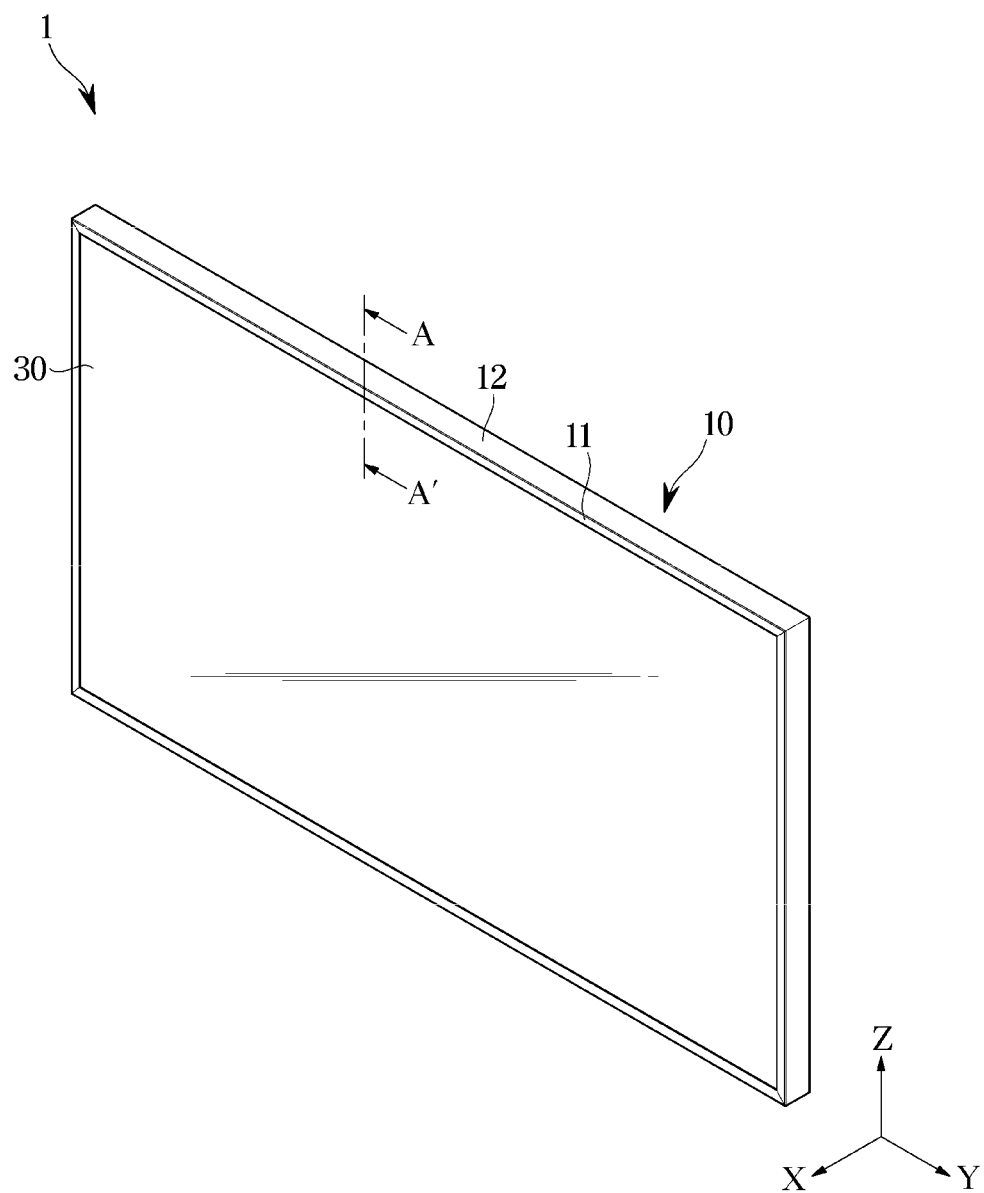
FIG. 1 is a perspective view illustrating a display apparatus according to an embodiment of the disclosure.

In addition, a term "forward" used herein indicates a direction parallel to the x-axis shown in FIG. 1. Terms "upper side" and "lower side" indicate directions parallel to the z-axis shown in FIG. 1. "Both sides" and "lateral sides" indicate a direction parallel to the y-axis shown in FIG. 1.

Therefore, it is an aspect of the disclosure to provide a display apparatus including a sealing member having an improved structure.

It is another aspect of the disclosure to provide a display apparatus having waterproof and dustproof functions, and having improved assembly performance and productivity.

Figure 2:
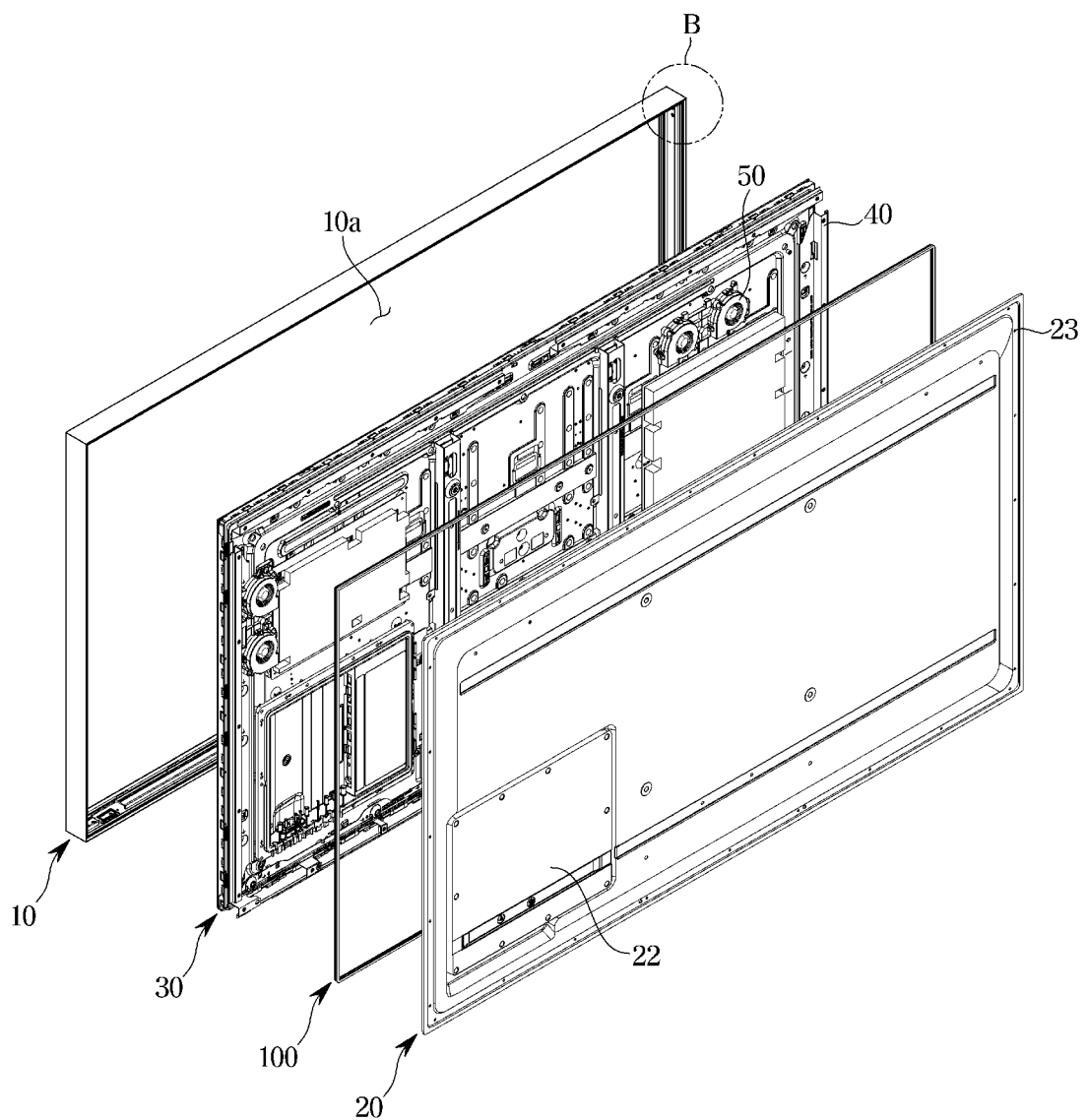
FIG. 2 is an exploded perspective view illustrating the display apparatus according to the embodiment of the disclosure.

FIG. 1 is a perspective view illustrating a display apparatus according to an embodiment of the disclosure. FIG. 2 is an exploded perspective view illustrating the display apparatus according to the embodiment of the disclosure.

Referring to FIGS. 1 and 2, the display apparatus 1 may include a housing 10 forming the external appearance thereof. The housing 10 may have an opening 10a. The opening 10a may be provided to pass therethrough from the front surface to the rear surfaces of the housing 10. An image displayed by a display module 30 may be viewed to the outside through the opening 10a.

The housing 10 may have a box shape with front and rear surfaces that are open. The housing 10 may be provided to accommodate the display module 30 therein. The housing 10 may include a bezel portion 11 covering a front edge of the display module 30 and a side portion 12 bent from an edge of the bezel portion 11 rearward.

The display apparatus 1 may include the display module 30. The display module 30 may include a display panel on which an image is displayed. The display module 30 may be disposed inside the housing 10 such that an image displayed on the display panel is exposed to the outside of the housing 10 through the opening 10a.

Although not shown in the drawings, the display module 30 may further include a backlight unit that supplies light to the display panel. The backlight unit may be arranged while being spaced apart from the rear side of the display panel.

The backlight unit may include a plurality of light sources for generating light. The plurality of light sources represent an element that emits light. The plurality of light sources may include not only Light Emitting Diodes (LEDs), but also all elements or devices that generate and emit light.

According to the concept of the disclosure, the display apparatus 1 may include a direct type backlight unit in which the light source is disposed directly below the display panel, or an edge type backlight unit in which the light source is disposed on a side of the display panel, as a non-emissive display panel. In addition, the display apparatus 1 may include an emissive type display panel in which a plurality of pixels constituting the display panel generate light by themselves to generate an image. That is, the display apparatus 1 according to the concept of the disclosure is not limited on the type of the display panel or the backlight unit.

A rear chassis may be provided on the rear surface of the display module 30. The rear chassis may be provided to cover the rear surface of the display module 30. A printed circuit board may be mounted on the rear chassis. In addition, as shown in FIG. 2, a fan 50 may be mounted on the rear chassis. In addition, a support bracket 40 may be mounted on the rear chassis.

The fan 50 may be installed on the rear chassis that forms the rear of the display module 30. The fan 50 may be disposed in a closed space formed by the housing 10, a housing cover 20, the rear chassis, and a sealing member 100. The fan 50 may form an airflow in the closed space to discharge heat generated from the display module 30 to the outside of the display apparatus 1. In detail, the fan 50 may allow air existing between the display module 30 and the housing cover 20 to smoothly flow, to discharge heat from the display module 30 to the housing cover 20.

The support bracket 40 may be mounted on the rear chassis. The housing cover 20 may be coupled to the support bracket 40. Details thereof will be described below.

The display apparatus 1 may include the housing cover 20 coupled to the rear surface of the housing 10 to cover the opening 10a. The housing cover 20 may be coupled to the rear surface of the housing 10 to cover the rear surface of the display module 30.

According to the concept of the disclosure, the display apparatus 1 may include a sealing member 100 disposed between the housing 10 and the housing cover 20 to seal a gap between the housing 10 and the housing cover 20. The sealing member 100 may seal the gap between the housing 10 and the housing cover 20 to prevent moisture or dust from infiltrating into the display apparatus 1.

The sealing member 100 may be provided to have a predetermined cross-sectional shape, and the cross-sectional shape will be described below. The sealing member 100 may be disposed along edges of the housing 10. To this end, the sealing member 100 may have a length substantially corresponding to the lengths of the four sides of the housing 10. In addition, the sealing member 100 may be provided in a closed loop shape without having a broken part. In the drawings, the sealing member 100 is illustrated in a rectangular shape for the sake of convenience of illustration, but since the sealing member 100 is formed of a flexible material, the shape may not be fixed. For example, the sealing member 100 may have an approximately elliptical shape before being coupled to the housing 10.

Figure 3:
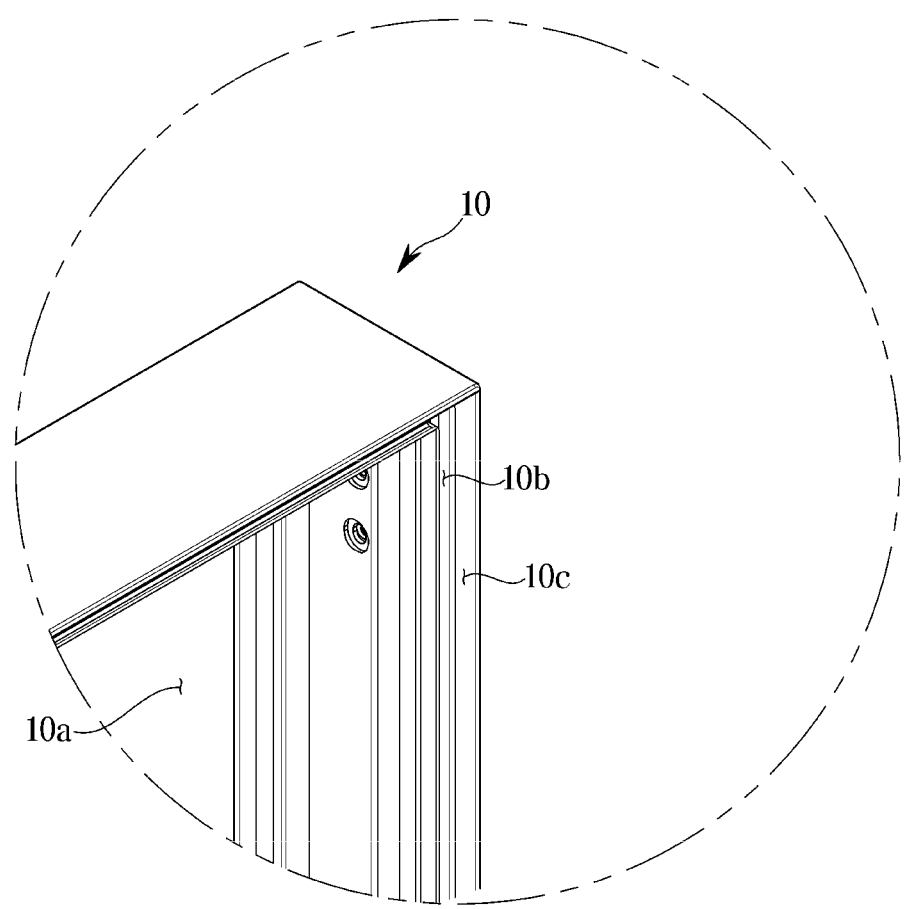
FIG. 3 is an enlarged view illustrating portion B of FIG. 2.
Figure 4:
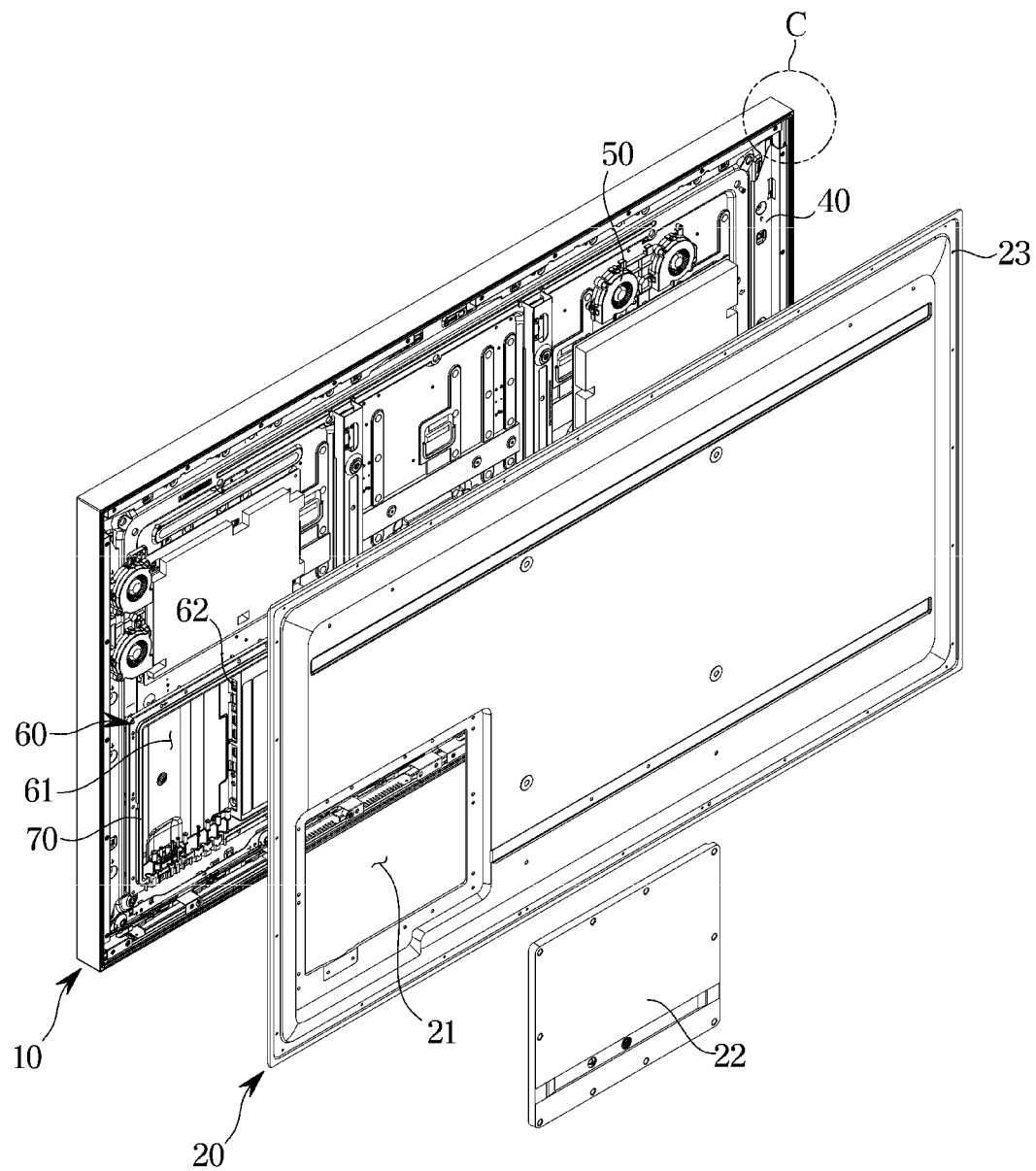
FIG. 4 is a rear perspective view illustrating the display apparatus according to the embodiment of the disclosure, showing a state in which a housing cover is separated from the display apparatus.
Figure 5:
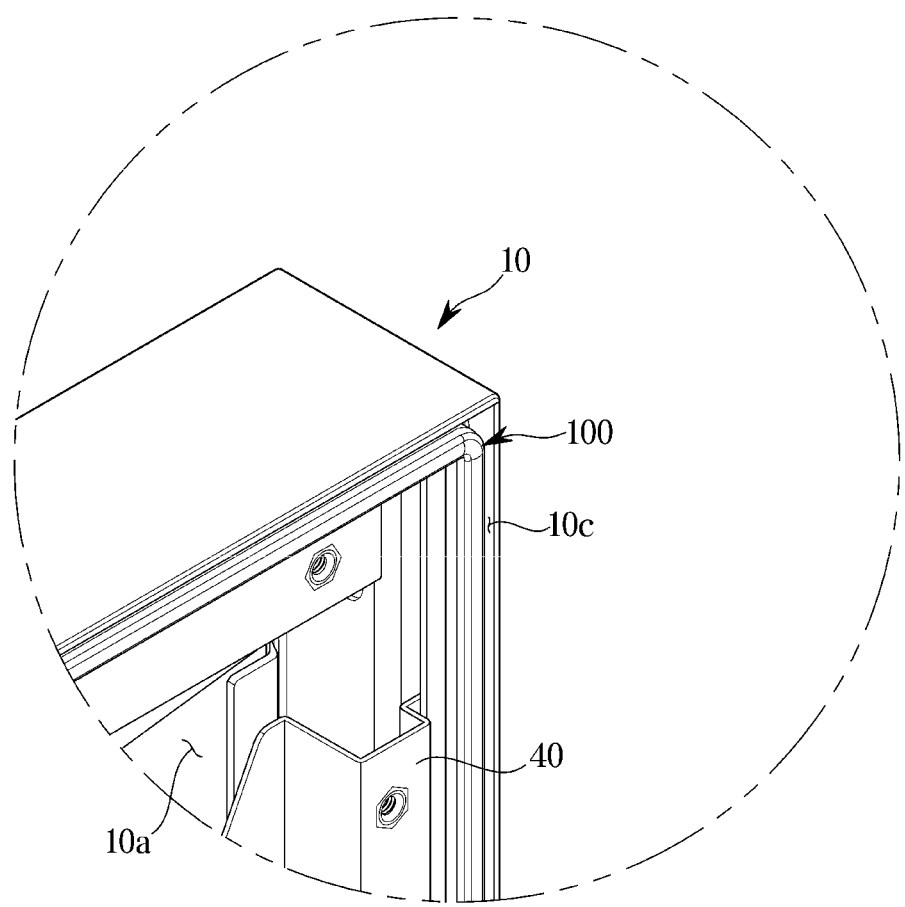
FIG. 5 is an enlarged view illustrating portion C of FIG. 4.
Figure 6:
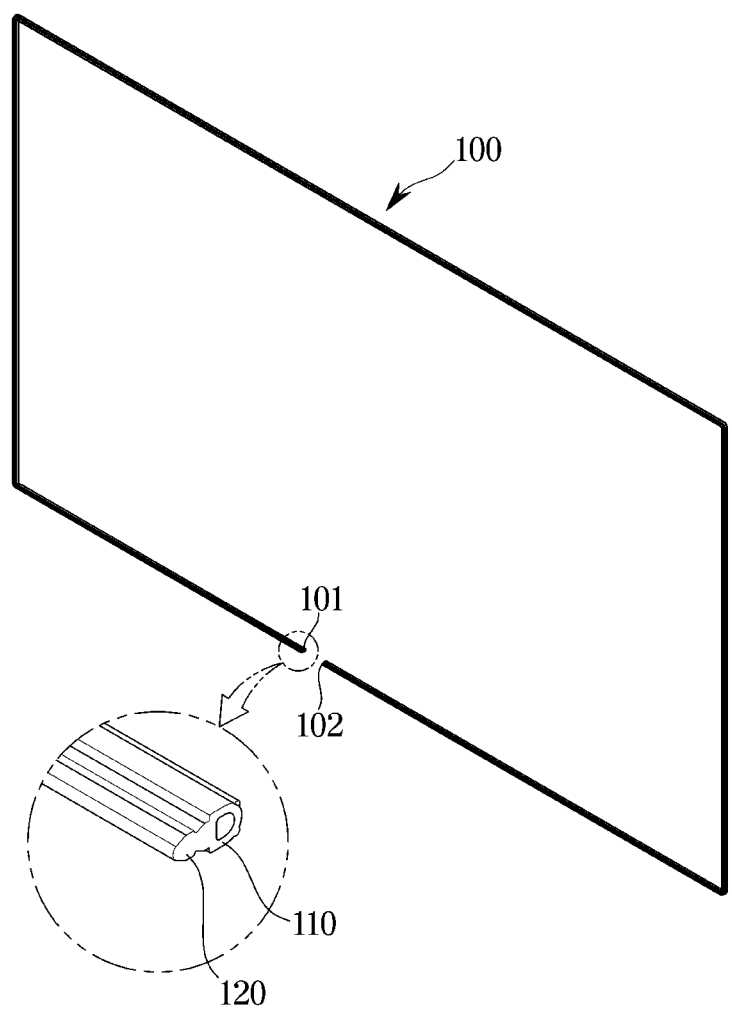
FIG. 6 is a view illustrating a sealing member included in the display apparatus according to the embodiment of the disclosure.

FIG. 3 is an enlarged view illustrating portion B of FIG. 2. FIG. 4 is a rear perspective view illustrating the display apparatus according to the embodiment of the disclosure, showing a state in which a housing cover is separated from the display apparatus. FIG. 5 is an enlarged view illustrating portion C of FIG. 4. FIG. 6 is a view illustrating a sealing member included in the display apparatus according to the embodiment of the disclosure.

Referring to FIG. 3, the housing 10 includes a sealing member groove 10b provided to allow the sealing member 100 to be inserted thereinto and a cover groove 10c provided to allow a bent portion 20a of the housing cover 20 to be inserted thereinto.

Each of the sealing member groove 10b and the cover groove 10c may be formed on the rear surface of the housing 10. The sealing member groove 10b and the cover groove 10c may be arranged to be laterally spaced from each other. Each of the sealing member groove 10b and the cover groove 10c may be provided along the edge of the housing 10. In addition, each of the sealing member groove 10b and the cover groove 10c may be formed by a portion of the rear surface of the housing 10 being recessed forward.

Referring to FIG. 4, the display apparatus 1 may further include a connector case 60. The connector case 60 may be coupled to the rear surface of the display module 30. In detail, the connector case 60 may be mounted on the rear chassis of the display module 30.

The connector case 60 may have an inner space 61 formed by being recessed toward the front of the display apparatus 1. A plurality of connectors 62 may be provided in the inner space 61 of the connector case 60.

In addition, the display apparatus 1 may further include a connector sealing member 70 provided along an edge of the connector case 60. The connector sealing member 70 may be disposed between the connector case 60 and the housing cover 20 to seal a gap between the connector case 60 and the housing cover 20.

The housing cover 20 may include a cover hole 21 formed at a position corresponding to the connector case 60. In addition, the display apparatus 1 may further include a connector cover 22 coupled to the housing cover 20 to cover the cover hole 21.

The housing cover 20 may include a plurality of fastening holes 23 as shown in FIG. 4. The housing 10 or the support bracket 40 may include a plurality of fastening holes (not shown) corresponding to the fastening holes 23 of the housing cover 20. By fastening a fastening member (not shown) to the fastening hole 23, the housing cover 20 may be coupled to the housing 10 or the support bracket 40. Although not shown, there is no limitation on the type of the fastening member. For example, the fastening member may be a screw.

Referring to FIG. 5, the sealing member 100 according to the embodiment of the disclosure may be provided to be bendable at the corners of the housing 10 without a separate member.

In general, the housing 10 may be provided in a box shape having a rectangular opening. The housing 10 may have a square opening. In the case of a housing with a square or rectangular opening, the housing has four corners. In order to prevent moisture and dust from flowing into the housing 10, the sealing member 100 needs to uniformly seal the entire circumference of the housing 10. In order to seal the entire circumference of the housing 10, the sealing member 100 needs to be bent at 90 degrees at the corner of the housing 10. However, in a process of the sealing member being bent at 90 degrees, the thickness of the sealing member may become non-uniform to cause a gap to be formed between the sealing member and the housing cover.

When the conventional sealing member is bent at 90 degrees, the sealing member is compressed and becomes thicker to thereby generate a gap between the housing cover and the sealing member. Moisture and dust may infiltrate through the gap, and the sealing member may not function properly.

In the conventional technology, in order to remove such a limitation, a separate corner sealing member for sealing the corner of the display apparatus has been provided. The corner sealing member bent at 90 degrees is disposed at each corner, and thus, the display apparatus is provided with four corner sealing members. In addition, the corner sealing member has one end and the other end respectively coupled to a long side sealing member and a short side sealing member each provided in a straight line shape. In this process, an adhesive needs to be applied such that the one end of the corner sealing member is bonded to the long side sealing member and an adhesive needs to be applied such that the other end of the corner sealing member is bonded to the short side sealing member. Therefore, conventionally, the sealing member includes four corner sealing members, two long-side sealing members, and two short-side sealing members, and in order for the sealing members to form a closed loop, an adhesive needs to be applied twice for each corner sealing member. Therefore, a total of eight adhesive application processes are required.

According to the concept of the disclosure, the sealing member 100 may form a closed loop with only one adhesive application process. The sealing member 100 may be provided to be bendable at 90 degrees without a separate corner member at the corner of the housing 10. In addition, as will be described with reference to FIG. 6, the sealing member 100 may form a closed loop with only one application of an adhesive.

Referring to FIGS. 5 and 6, the sealing member 100 according to the concept of the disclosure may be provided to be bendable at 90 degrees without a separate corner member even at the corner of the housing 100. Even when the sealing member 100 is bent at 90 degrees, the sealing member 100 may be not subject to a great change in thickness thereof. Accordingly, the sealing member 100 may prevent a lifting from occurring in the housing cover 20 due to a change in thickness thereof even at the corner of the housing 10. That is, even at the corner of the housing 10, a gap may not be formed between the sealing member 100 and the housing cover 20.

According to the concept of the disclosure, the sealing member 100 may be provided to have a predetermined cross-sectional shape, and may be provided to extend in one direction. The sealing member 100 may be provided as a straight line shaped member having a uniform cross-sectional shape. Since the sealing member 100 is formed of a flexible material, the sealing member may be bent as described above, and a closed loop may be formed by bonding one end 101 of the sealing member to the other end 102 of the sealing member with an adhesive. That is, the closed loop may be formed with only one application of the adhesive.

Therefore, according to the concept of the disclosure, the production process of the sealing member may be simplified, and thus, productivity of the sealing member may be improved.

Figure 7:
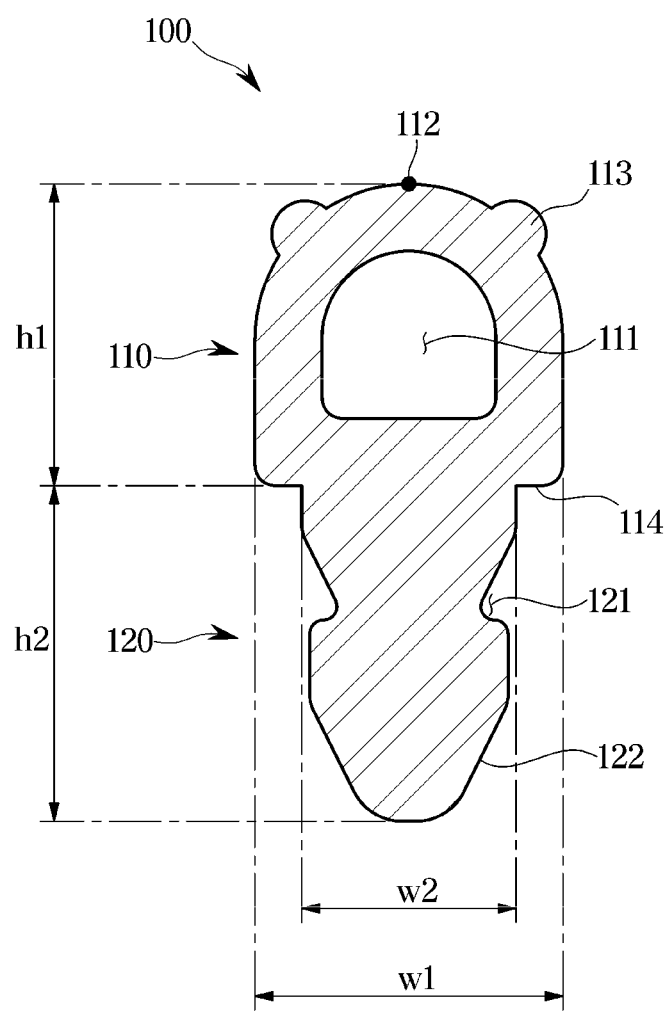
FIG. 7 is a cross-sectional view illustrating the sealing member shown in FIG. 6.

FIG. 7 is a cross-sectional view illustrating the sealing member shown in FIG. 6.

Referring to FIG. 7, the sealing member 100 according to the embodiment of the disclosure may include a head portion 110 and a protrusion portion 120 extending from the head portion 110.

The sealing member 100 may be disposed between the housing 10 and the housing cover 20 to seal a gap between the housing 10 and the housing cover 20. The sealing member 100 may be disposed such that the head portion 110 comes in contact with the housing cover 20 and the protrusion portion 120 is inserted into the sealing member groove 10b of the housing 10.

The head portion 110 may include a hollow 111. The hollow 111 may be provided in an approximately semicircular or arc shape. In more detail, referring to FIG. 7, the hollow 111 may have an upper portion in an approximately semicircular shape and a lower portion in an approximately rectangular shape. The hollow 111 may have an upper portion in a semi-circular shape, and the head portion 110 has an upper surface in a semi-circular shape to correspond in shape to the upper portion of the hollow 111. The hollow 111 may have a cross section including an arc portion in an arc shape and a straight portion provided in a straight line. The arc portion may be arranged in the upper side of the hollow 111, and the straight portion may be arranged in the lower side of the hollow 111.

The upper surface of the head portion 110 may be provided in a curved surface. The upper surface of the head portion 110 may be provided in an arc shape, as described above. The head portion 110 may include a contact point 112 positioned at the center of the upper surface thereof. The contact point 112 may indicate the highest point of the head portion 110. The contact point 112 may indicate a point at the highest position on the sealing member 100. Meanwhile, the upper surface of the head portion 110 may be provided to come in contact with the housing cover 20. Accordingly, the upper surface of the head portion 110 may be referred to as a contact surface. The contact point 112 may indicate the center of the contact surface. The center of the contact surface may indicate the center of symmetry of the contact surface or the center point of the contact surface.

The head portion 110 may further include a pair of protrusions 113 disposed on both sides of the contact point 112. The protrusion 113 disposed on one side of the contact point 112 and the protrusion 113 disposed on the other side of the contact point 112 may be symmetrically disposed with respect to the contact point 112. The protrusion 113 may be provided to have an approximately semicircular cross section. Since the contact point 112 is the highest point on the head portion 110, the contact point 112 may be located higher than the highest point on the protrusion 113. Although not shown in the drawing, the contact point 112 may be located on the same level as the highest point on the protrusion 113. That is, the contact point 112 may be located at the same height as the highest point on the protrusion 113.

The head portion 110 may further include a support portion 114 that forms a lower surface of the head portion 110 and protrudes to lateral sides of the protrusion portion 120. The support portion 114 may be provided to come in contact with a support wall 14 of the housing 10 to be described below. The support portion 114 may be supported by the support wall 14.

The protrusion portion 120 may be formed to extend downward from the head portion 110. The protrusion portion 120 may be connected to the support portion 114. The protrusion portion 120 and the head 110 may be integrally formed with each other. For example, the sealing member 100 may be formed by extruding a base material formed of a flexible material, such as rubber.

The protrusion portion 120 may further include a fixing groove 121 provided to allow a fixing protrusion 15, which will be described below, to be inserted thereinto. The fixing grooves 121 may be provided on both sides of the protrusion portion 120. The fixing grooves 121 may be provided in a pair. As the fixing protrusion 15 to be described below is inserted into the fixing groove 121, the sealing member 100 inserted into the sealing member groove 10b may be prevented from being withdrawn from the sealing member groove 10b. The coupling force between the sealing member 100 and the sealing member groove 10b may be increased.

The protrusion portion 120 may further include a guide portion 122 provided to guide the protrusion portion 120 when the sealing member 100 is inserted into the sealing member groove 10b. The guide portion 122 may be provided at a lower end of the protrusion portion 120, and may be provided to have a width that decreases as being extended downward. With the guide portion 122, the protrusion portion 120 may be smoothly inserted into the sealing member groove 10b. Accordingly, the sealing member 100 may be easily inserted into the sealing member groove 10b, and assembly and productivity may be improved.

Referring to FIG. 7, in the sealing member 100 according to the embodiment of the disclosure, the height h1 of the head portion 110 in the upper and lower side direction on the drawing is provided to be smaller than the height h2 of the protrusion portion 120 in the upper and lower side direction on the drawing. This may be expressed as an equation as follows.

$$h1 < h2$$

According to the concept of the disclosure, since the height h2 of the protrusion portion 120 is provided larger than the height h1 of the head portion 110, the coupling force of the sealing member 100 to the sealing member groove 10b may be increased. When the height h2 of the protrusion portion 120 is relatively small, the sealing member 100 may be easily separated from the sealing member groove 10b by an external force. In particular, the sealing member 100 may be separated from the corner of the housing 10 where a strong coupling force is required. As a result, a gap may be formed between the housing 10 and the housing cover 20, and moisture and dust may infiltrate into the gap. As described above, in the sealing member 100 according to the concept of the disclosure, the height h2 of the protrusion portion 120 is greater than the height h1 of the head portion 110, so that the sealing member 100 may be coupled to the sealing member groove 10b with a strong coupling force. Accordingly, even when the sealing member 100 is bent at 90 degrees at the corner of the housing 10, the sealing member 100 may be prevented from being withdrawn from the sealing member groove 10b. The sealing member 100 may seal a gap between the housing 10 and the housing cover 20 even at the corner of the housing 10, and prevent moisture and dust from infiltrating into the gap.

Hereinafter, the length of the sealing member 100 in the left and right side direction on FIG. 7 may be referred to as a width.

According to the embodiment of the disclosure, the maximum width w1 of the head portion 110 may be equal to the width w1 of the support portion 114. In other words, the head portion 110 may have a maximum width at the support portion 114. The protrusion portion 120 may have a maximum width at the upper end thereof connected to the head portion 110.

According to the embodiment of the disclosure, the maximum width w1 of the head portion 110 and the maximum width of the protrusion portion 120 may be set to satisfy the following relational expression.

$$w1 * 2/3 < w2$$

That is, the maximum width w2 of the protrusion portion 120 may be provided larger than ⅔ of the maximum width w1 of the head portion 110.

In the conventional technology, the width of the protrusion portion is excessively small compared to the width of the head portion, which causes a difficulty in stably seating the sealing member in the sealing member groove. In order to remove such a limitation, according the conventional technology, an adhesive is applied to the sealing member groove before the sealing member is inserted into the sealing member groove. However, such a process needs to be performed several to tens of times along the edge of the housing. Accordingly, the assembling performance of the sealing member is lowered and productivity is lowered.

According to the concept of the disclosure, the width of the protrusion portion 120 may be sufficiently large compared to the width of the head portion 110. Accordingly, the sealing member 100 may be stably seated in the sealing member groove 10b without application of a separate adhesive. An operator may easily couple the sealing member 100 to the sealing member groove 10b using a rolling jig (not shown) and the like. In this case, a process of applying an adhesive to the sealing member groove 10b or the sealing member 100 may be omitted. Accordingly, according to the concept of the disclosure, when assembling the sealing member 100 to the sealing member groove 10b, assembling performance is improved, and further, the productivity of the display apparatus 1 may be improved.

Figure 8:
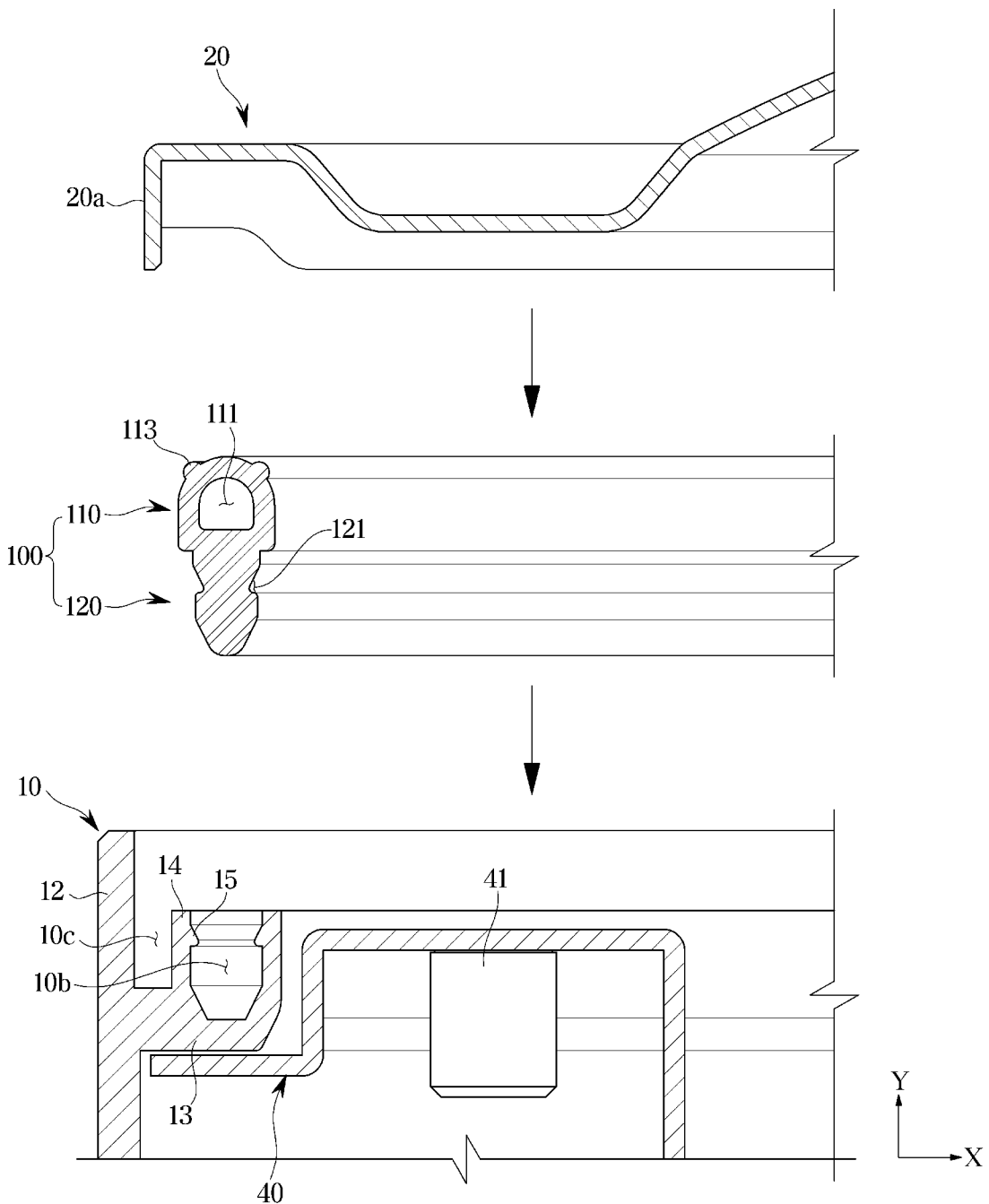
FIG. 8 is a view illustrating cross sections of a housing, a sealing member, and a housing cover included in the display apparatus according to the embodiment of the disclosure before being coupled to each other.
Figure 9:
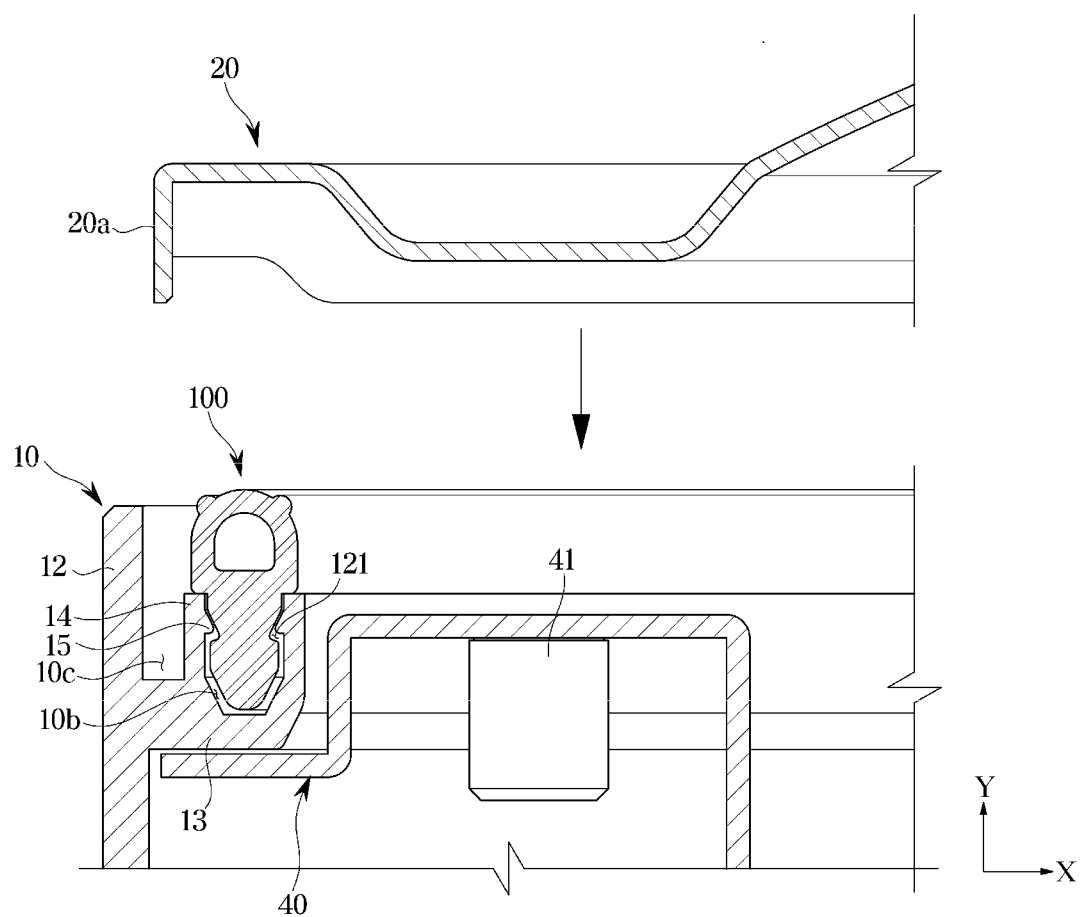
FIG. 9 is a view illustrating cross sections of a housing, a sealing member, and a housing cover included in the display apparatus according to the embodiment of the disclosure which are coupled to each other.
Figure 10:
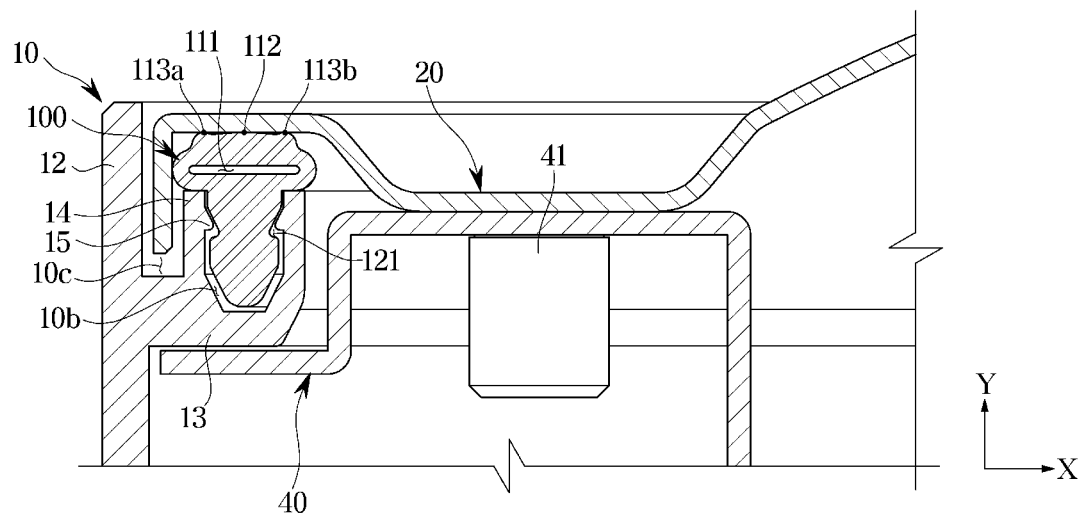
FIG. 10 is a cross-sectional view taken along line A-A' of FIG. 1, which shows a state in which the housing, the sealing member, and the housing cover are coupled to each other.

FIG. 8 is a view illustrating cross sections of a housing, a sealing member, and a housing cover included in the display apparatus according to the embodiment of the disclosure before being coupled to each other. FIG. 9 is a view illustrating cross sections of a housing, a sealing member, and a housing cover included in the display apparatus according to the embodiment of the disclosure which are coupled to each other. FIG. 10 is a cross-sectional view taken along line A-A' of FIG. 1, which shows a state in which the housing, the sealing member, and the housing cover are coupled to each other.

Hereinafter, a process of arranging the sealing member 100 between the housing 10 and the housing cover 20 in the display apparatus 1 according to the embodiment of the disclosure will be described in detail with reference to FIGS. 8 to 10.

Referring to FIG. 8, the support bracket 40 may be accommodated in the housing 10. According to the embodiment of the disclosure, the support bracket 40 may be coupled to the rear chassis of the display module 30. As the support bracket 40 is coupled to the rear chassis, and the housing cover 20 is coupled to the support bracket 40, the housing cover 20 may be provided to cover the rear surface of the housing 10. However, the disclosure is not limited thereto, and the housing cover 20 may be provided to be directly coupled to the housing 10 or the rear chassis of the display module 30 without using the support bracket 40.

In the following description, a term "lateral (sideways)" indicates a direction parallel to the x-axis shown in FIGS. 8 to 10. Further, "upward" or "downward" indicates a direction parallel to the y-axis shown in FIGS. 8 to 10.

The housing 10 may include an extension portion 13 extending laterally from the side portion 12 toward the inside of the housing 10. In addition, the housing 10 may include a pair of support walls 14 extending upward from the extension portion 13. The sealing member groove 10b formed to allow the sealing member 100 to be inserted thereinto may be defined by the pair of support walls 14 and the extension portion 13.

Each of the pair of support walls 14 may further include a fixing protrusion 15 protruding toward the sealing member groove 10b. The fixing protrusion 15 may be provided to be inserted into the fixing groove 121 of the sealing member 100. Since the fixing protrusion 15 is inserted into the fixing groove 121, the sealing member 100 may be more stably coupled to the sealing member groove 10b. As the fixing protrusion 15 is inserted into the fixing groove 121, the coupling force between the sealing member 100 and the sealing member groove 10b may be increased.

Referring to FIG. 9, the protrusion portion 120 of the sealing member 100 may be inserted into the sealing member groove 10b. According to the concept of the disclosure, when the sealing member 100 is inserted into the sealing member groove 10b, the sealing member 100 may be stably seated in the sealing member groove 10b without an adhesive being applied to the sealing member 100 or the sealing member groove 10b. The operator may easily seat the sealing member 100 in the sealing member groove 10b using a rolling jig (not shown) or the like. Accordingly, assembly and productivity of the display apparatus 1 may be improved.

Referring to FIG. 10, after the sealing member 100 is inserted into the sealing member groove 10b, the housing cover 20 may be coupled to the support bracket 40. The housing cover 20 includes the plurality of fastening holes (23 in FIG. 11), and the support bracket 40 may include a fastening portion 41 corresponding to the fastening hole 23 of the housing cover 20. The user may couple the housing cover 20 to the support bracket 40 by passing a fastening member (not shown), such as a screw, through the fastening hole 23 and then fastening the fastening member to the fastening portion 41. As the housing cover 20 is coupled to the support bracket 40, the housing cover 20 may cover the rear surface of the housing 10. In addition, the housing cover 20 may cover the rear surface of the display module 30. As described above, the housing cover 20 may be coupled to the housing 10 rather than to the support bracket 40, and the housing cover 20 may be coupled to the rear chassis forming the rear surface of the display module 30.

Referring to FIG. 10, the housing cover 20 may include the bent portion 20a formed by one end of the housing cover 20 being bent downward. The bent portion 20a may be inserted into the cover groove 10c of the housing 10. The bent portion 20a may be inserted into the cover groove 10c, thereby primarily preventing moisture and dust from flowing into the gap between the housing cover 20 and the housing 10. However, even when the bent portion 20a is inserted into the cover groove 10c, since the gap between the housing 10 and the housing cover 20 is not sealed, waterproof and dustproof effect may not be ensured.

When the housing cover 20 is coupled to the support bracket 40, the head portion 110 of the sealing member 100 may be compressed by the housing cover 20 as shown in FIG. 10.

According to the concept of the disclosure, when the head portion 110 of the sealing member 100 is compressed by the housing cover 20, at least three points 112, 113a, and 113b are provided to make line contact with the housing cover 20. The head portion 110 may come in contact with the housing cover 20 at the contact point 112 as well points 113a and 113b each of the pair of protrusions 113 in a line contact manner.

In the conventional technology, the upper surface of the sealing member is provided as a flat surface. In the case of the conventional sealing member, the sealing member has been often biased to one side relative to the extending direction of the sealing member in a process of the sealing member come in contact with the housing cover. Particularly, with respect to the direction in which the sealing member extends, part of the sealing member is biased to one side, and remaining part of the sealing member is biased to the other side. When the sealing member is biased to one side with respect to the direction in which the sealing member extends, a contact area between the upper surface of the sealing member and the housing cover may be reduced, thereby reducing the sealing ability. In particular, at an inflection point at which the sealing member formed to be biased to one side starts to be biased to the other side, the gap between the sealing member and the housing cover may increase, and the sealing performance may be significantly lowered.

According to the concept of the disclosure, the head portion 110 of the sealing member 100 may be provided to make a line contact with the housing cover 20 on at least three points 112, 113a, and 113b. Accordingly, the contact area between the sealing member 100 and the housing cover 20 may be increased, and the sealing performance of the sealing member 100 may be improved.

In addition, according to the concept of the disclosure, since the hollow 111 of the sealing member 100 is provided in a substantially semicircular shape, and the upper shape of the head portion 110 is also provided in a semicircular shape, even when the head portion 110 is compressed by the housing cover 20, the head portion 110 may be prevented from being biased to one side or the other side of the protrusion portion 120. In addition, as described above, since the maximum width w2 of the protrusion 120 is relatively large, the head portion 110 may be prevented from being biased to one side or the other side of the protrusion portion 110 in a state in which the protrusion portion 120 is inserted into the sealing member groove 10b.

Accordingly, according to the concept of the disclosure, even when the sealing member 100 is compressed by the housing cover 20, the sealing member 100 may be prevented from being biased to one side or the other side with respect to the direction in which the sealing member 100 extends. In addition, the sealing member 100 may be provided to make a line contact with the housing cover 20 on at least three points 112, 113a, and 113b. Accordingly, the sealing member 100 may uniformly seal the gap between the housing 10 and the housing cover 20 over the entire area of the sealing member 100. That is, the sealing ability of the sealing member 100 may be improved. In addition, the waterproof and dustproof capabilities of the display device 1 may be improved.

Figure 11:
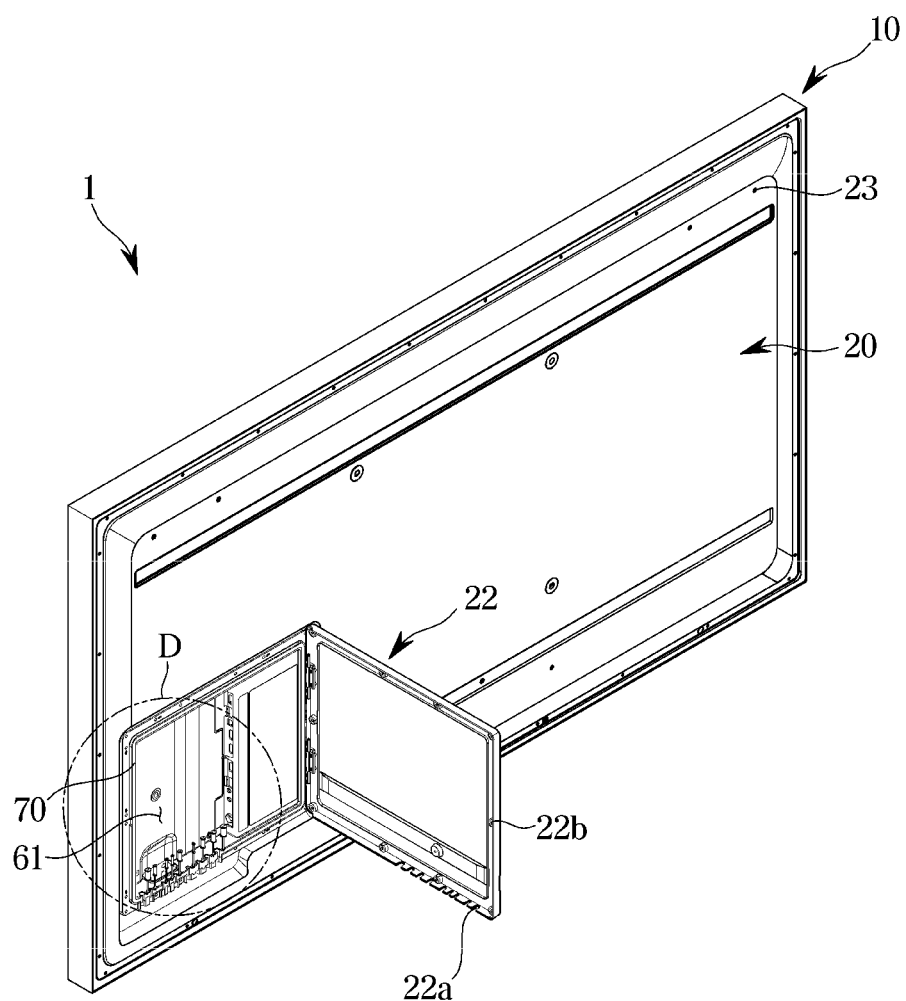
FIG. 11 is a rear perspective view illustrating the display apparatus according to the embodiment of the disclosure, which shows a connector cover in an open state.
Figure 12:
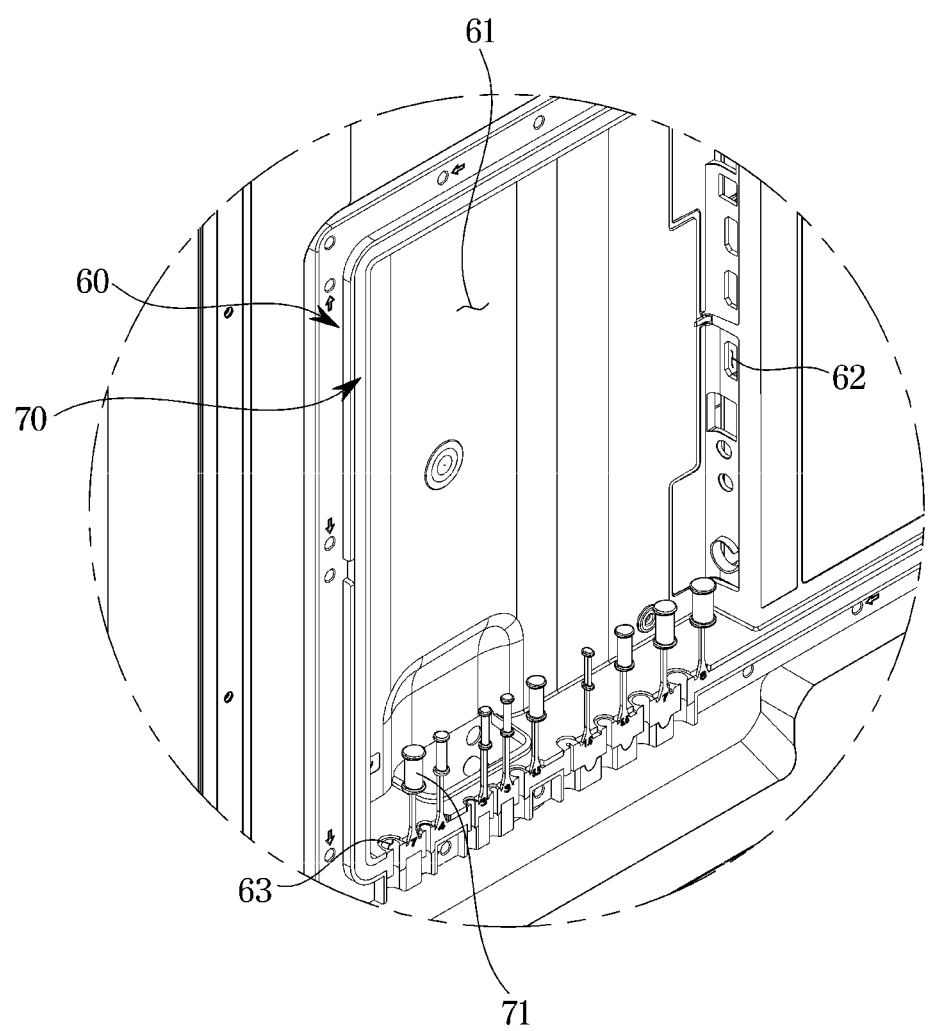
FIG. 12 is an enlarged view illustrating portion D of FIG. 11.

FIG. 11 is a rear perspective view illustrating the display apparatus according to the embodiment of the disclosure, which shows a connector cover in an open state. FIG. 12 is an enlarged view illustrating portion D of FIG. 11.

Referring to FIG. 11, the display apparatus 1 according to the embodiment of the disclosure may include the connector case 60. The connector case 60 may be mounted on the rear chassis forming the rear surface of the display module 30 so as to be disposed between the rear chassis and the housing cover 20.

The connector case 60 may have the inner space 61 formed by being recessed toward the front of the display apparatus 1. A plurality of connectors 62 may be provided in the inner space 61 of the connector case 60. The plurality of connectors 62 may include a power receiver.

The housing cover 20 may include the connector cover 22 disposed at a position corresponding to the connector case 60. As shown in FIG. 11, the connector cover 22 may be hinged to the housing cover 20 so as to be rotatable with respect to the housing cover 20. However, the disclosure is not limited thereto. The connector cover 22 may be detachably coupled to the housing cover 20 rather than being hinged to the housing cover 20.

The connector cover 22 may include a plurality of fastening holes 22b. The plurality of fastening holes 22b may be provided to correspond to a fastening portion (not shown) provided in the connector case 60. The user may fix the connector cover 22 to the connector case 60 by passing a fastening member (not shown) through the fastening hole 22b and then fastening the fastening member to the fastening portion.

The connector case 60 may further include the connector sealing member 70 provided to seal a gap between the connector case 60 and the connector cover 22 when the connector cover 22 is coupled to the connector case 60 to cover the connector case 60. The connector sealing member 70 may prevent moisture and/or dust from entering the inner space 61 of the connector case 60 from the outside of the display apparatus 1.

Referring to FIG. 11, the connector cover 22 has a plurality of first cable grooves 22a allowing to pass cables (not shown) extending from the outside of the display apparatus 1 to the inner space 61.

Referring to FIG. 12, the connector case 60 may include a plurality of second cable grooves 63 provided to correspond to the plurality of first cable grooves 22a, respectively. The first cable groove 22a and the second cable groove 63 may form one hole when the connector cover 22 is coupled to the connector case 60. A cable (not shown) may be withdrawn from the inner space 61 to the outside of the connector case 60 through the hole. Even when the connector cover 22 covers the connector case 60, the cable (not shown) may be withdrawn out of the connector case 60 through the cable hole (not shown) formed by the first cable groove 22a and the second cable groove 63.

The sealing member 70 may further include a cable hole sealing portion 71 inserted into the cable hole (not shown) formed by the first cable groove 22a and the second cable groove 63 to seal the cable hole (not shown). A plurality of connectors 62 may be provided in the connector case 60, and a user may use only some of the plurality of connectors 62 as needed. A cable (not shown) connected to the connector 62 may be withdrawn from the inner space 61 to the outside of the connector case 60 through the cable hole (not shown). In this case, the cable (not shown) may block the cable hole (not shown). Accordingly, the cable hole may be sealed. However, a connector 62 not used by the user does not have a cable (not shown) and thus has the cable hole (not shown) kept open. In this case, moisture and dust may enter through the cable hole. To prevent such a limitation, the cable hole may be provided at the lower end of the connector case 60. However, even when the cable hole is provided at the lower end of the connector case 60, infiltration of moisture and dust is not easily prevented. The cable hole sealing portion 71 may be a configuration extending from the sealing member 70 and may be inserted into a cable hole (not shown), into which a cable is not inserted as being not used by a user, to seal the cable hole (not shown). The cable hole sealing portions 71 may be provided corresponding in number to the number of cable holes. Accordingly, each of the cable holes may be sealed by the cable or the cable hole sealing portion 71.

Figure 13:
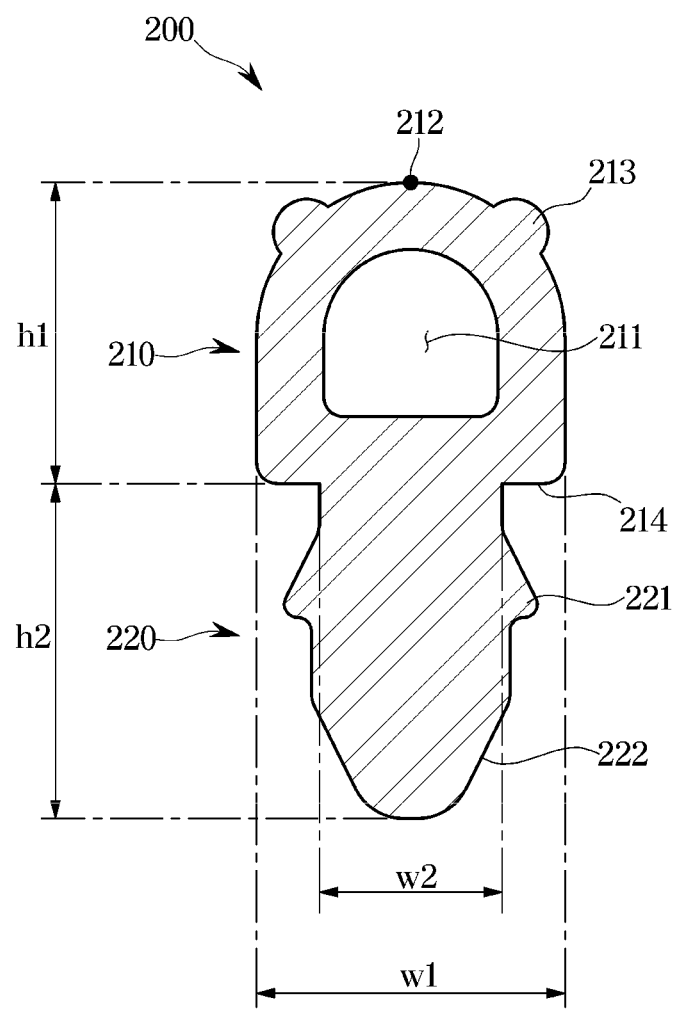
FIG. 13 is a cross-sectional view illustrating a sealing member of a display apparatus according to another embodiment of the disclosure.
Figure 14:
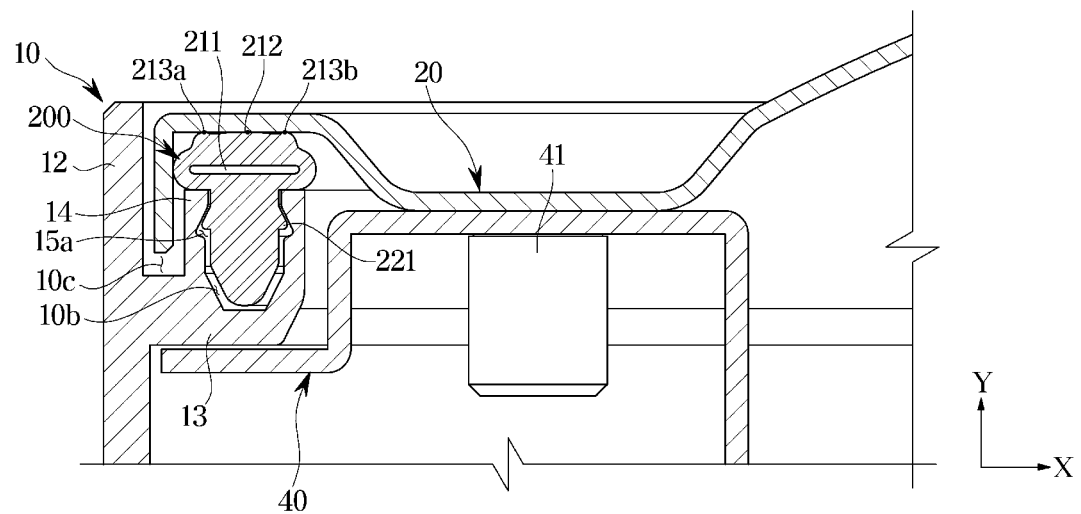
FIG. 14 is a cross-sectional view illustrating a housing, a sealing member, and a housing cover included in the display apparatus according to the another embodiment of the disclosure which are coupled to each other.

FIG. 13 is a cross-sectional view illustrating a sealing member of a display apparatus according to another embodiment of the disclosure. FIG. 14 is a cross-sectional view illustrating a housing, a sealing member, and a housing cover included in the display apparatus according to the another embodiment of the disclosure which are coupled to each other.

Hereinafter, another embodiment of the disclosure will be described with reference to FIGS. 13 and 14. Details of redundant descriptions thereof will be omitted.

Referring to FIG. 13, according to another embodiment of the disclosure, a sealing member 200 may include a head portion 210 and a protrusion portion 220.

The head portion 210 includes a hollow 211 provided in an approximately semicircular shape, a contact point 212 located at the center of an upper surface of the head portion 210, and a pair of protrusions 213 provided on both sides of the contact point 212. Further, the head portion 210 may include a support portion 214 that forms a lower surface of the head portion 210 and is supported by the support wall 14 of the housing 10.

The protrusion portion 220 may be formed to extend downward from the head portion 210. The protrusion portion 220 may include a pair of fixing protrusions 221 protruding laterally from both sides of the protrusion portion 220. In addition, the protrusion portion 220 may include a guide portion 222 provided to guide the sealing member 200 to be inserted into the sealing member groove 10b.

Referring to FIG. 14, the sealing member groove 10b according to the embodiment of the disclosure may be provided with a fixing groove 15a. In detail, each of the pair of support walls 14 may be provided with the fixing groove 15a formed in a shape corresponding to the fixing protrusion 221 of the protrusion portion 220. The fixing groove 15a may be formed by a portion of the support wall 14 being recessed inward. As the fixing protrusion 221 is inserted into the fixing groove 15a, the coupling force between the sealing member 200 and the sealing member groove 10b may be increased. Accordingly, the sealing member 200 may not be easily withdrawn from the sealing member groove 10b.

As is apparent from the above, the display apparatus can be provided with a sealing member having an improved structure The display apparatus can be provided with waterproof and dustproof functions, and improved assembly performance and productivity.

Although few embodiments of the disclosure have been shown and described, the above embodiment is illustrative purpose only, and it would be appreciated by those skilled in the art that changes and modifications may be made in these embodiments without departing from the principles and scope of the disclosure, the scope of which is defined in the claims and their equivalents.

What is claimed is:

1. A display apparatus comprising:
a housing including an opening, a continuous circumferential sealing member groove and a continuous circumferential cover groove provided to be spaced from and surrounding the sealing member groove;
a display module including a display panel, the display module arranged inside the housing, so that the display panel is viewable through the opening;
a housing cover coupleable to the housing so that the housing cover while coupled to the housing covers a rear surface of the display module, the housing cover including a circumferential portion that is bent to be insertable into the cover groove of the housing; and
a sealing member, insertable into the sealing member groove of the housing, disposed between the housing and the housing cover, and while the sealing member is inserted into the sealing member groove of the housing, the sealing member is configured to seal a gap between the housing and the housing cover, the sealing member including:
a contact surface convexly formed toward the housing cover, and
a first protrusion and a second protrusion arranged on the contact surface to both be symmetrical with respect to a center of the contact surface so that while the housing cover is coupled to the housing, the center of the contact surface, a point of the first protrusion, and a point of the second protrusion come in contact with the housing cover,
wherein at least a portion of the contact surface located between the first protrusion and the second protrusion is formed level with the first protrusion and the second protrusion or to protrude further than the first protrusion and the second protrusion toward the housing cover.

2. The display apparatus of claim 1, wherein the at least the portion of the contact surface is the center of the contact surface.

3. The display apparatus of claim 1,
wherein the sealing member further includes:
a protrusion portion formed to be inserted into the sealing member groove; and
a head portion configured to be compressed by the housing cover while the housing cover is coupled to the housing, the head portion including the contact surface.

4. The display apparatus of claim 3, wherein the head portion includes a hollow formed along a direction in which the sealing member extends, and
the hollow has a cross section including an arc portion and a straight portion.

5. The display apparatus of claim 3, wherein the contact surface is provided in an arc shape having a highest position at a center thereof.

6. The display apparatus of claim 3, wherein the sealing member extends in a first direction, and while the housing cover is coupled to the housing by moving in a second direction crossing the first direction, the protrusion portion has a length in the second direction greater than a length of the head portion in the second direction.

7. The display apparatus of claim 6, wherein a length of the head portion in a third direction crossing the first direction and the second direction is defined as a first width (w1), and a length of the protrusion portion in the third direction is defined as a second width (w2), the first width (w1) and the second width (w2) are set to satisfy w1*⅔<w2.

8. The display apparatus of claim 6, wherein a length of the head portion in a third direction crossing the first direction and the second direction is defined as a first width (w1), and a length of the protrusion portion in the third direction is defined as a second width (w2), the first width (w1) and the second width (w2) are set to satisfy w1*⅔<w2.

9. The display apparatus of claim 1, wherein the first protrusion and the second protrusion extend along a direction in which the sealing member extends.

10. The display apparatus of claim 1, wherein the sealing member is formed by extrusion, and one end of the sealing member is bonded to another end of the sealing member to form a closed loop.

11. The display apparatus of claim 1, wherein the housing further includes:
a side portion provided to cover a side surface of the display module;
an extension portion extending from the side portion in a first direction toward an inside of the housing;
a pair of support walls extending from the extension portion in a second direction toward the housing cover; and
the sealing member groove that is defined by the pair of support walls and the extension portion.

12. The display apparatus of claim 11, wherein the sealing member includes a protrusion portion formed to be inserted into the sealing member groove,
the protrusion portion includes a pair of fixing grooves formed by both side surfaces of the protrusion portion being recessed inward, and
each support wall of the pair of support walls includes a fixing protrusion formed configured to receive a corresponding one of the pair of fixing grooves to inhibit the sealing member from being withdrawn from the sealing member groove.

13. The display apparatus of claim 11, wherein the cover groove is formed between the side portion and a support wall of the pair of support walls.

14. The display apparatus of claim 1, further comprising a connector case accommodated in the housing, and having an inner space to accommodate a connector,
wherein the housing cover includes:
an opening portion corresponding to the connector case; and
a connector cover configured to open and close the inner space.

15. The display apparatus of claim 14, wherein the connector case includes a connector sealing member extending along an edge of the connector case and configured to seal a gap between the connector case and the connector cover.

16. A display apparatus comprising:
a display module;
a housing configured to accommodate the display module so that the display module is viewable through an opening in the housing and cover a side surface of the display module, the housing including a continuous circumferential sealing member groove and a continuous circumferential cover groove provided to be spaced from and surrounding the sealing member groove;
a housing cover couplable to a rear surface of the housing so that the housing cover while coupled to a rear surface of the housing covers a rear surface of the display module, the housing cover having a circumferential portion that is bent to be insertable into the cover groove of the housing; and
a sealing member, disposed between the housing and the housing cover, and configured to seal a gap between the housing and the housing cover, and the sealing member including;
a protrusion portion insertable into the sealing member groove of the housing, and
a head portion configured to be compressed by the housing cover, wherein the head portion includes:
a contact surface configured to come in contact with the housing cover and having an arc shape convexly formed toward the housing cover; and
a first protrusion and a second protrusion protruding from the contact surface toward the housing cover, the first protrusion and the second protrusion being arranged to be spaced apart from each other and both be symmetrical with respect to a center of the contact surface of the head portion so that while the housing cover is coupled to the housing, the center of the contact surface, a point of the first protrusion, and a point of the second protrusion come in contact with the housing cover.

17. The display apparatus of claim 16, wherein at least a portion of the contact surface located between the first protrusion and the second protrusion is formed level with the first protrusion and the second protrusion or to protrude further than the first protrusion and the second protrusion toward the housing cover.

18. The display apparatus of claim 16, wherein the sealing member extends in a first direction, and while the housing cover is coupled to the housing by moving in a second direction crossing the first direction, the protrusion portion has a length in the second direction greater than a length of the head portion in the second direction.

19. A display apparatus comprising:
a display module;
a housing configured to accommodate the display module, the housing including:
a side portion configured to cover a side surface of the display module,
an extension portion extending from the side portion,
a continuous circumferential sealing member groove formed in the extension portion and being spaced apart from the side portion by a predetermined distance, and
a continuous circumferential cover groove formed being spaced apart from and surrounding the sealing member groove, a housing cover coupleable to the housing so that the housing cover while coupled to the housing accommodates the display module together with the housing, the housing cover having a circumferential portion that is bent to be insertable into the cover groove of the housing; and
a sealing member disposed between the housing and the housing cover, and the sealing member including,
a protrusion portion formed to be inserted into the sealing member groove of the housing, and
a head portion including
a curved surface formed in a convex shape, and
a first protrusion and a second protrusion provided on the curved surface to both be symmetrical with respect to a center of the curved surface so that while the housing cover is coupled to the housing, the center of the curved surface, a point of the first protrusion, and a point of the second protrusion come in contact with the housing cover,
wherein at least a portion of the curved surface located between the first protrusion and the second protrusion is formed level with the first protrusion and the second protrusion or protrude further than the first protrusion and the second protrusion toward the housing cover while the housing cover is coupled to the housing.

* * * * *